United States Patent
Kim et al.

(10) Patent No.: US 10,886,329 B2
(45) Date of Patent: Jan. 5, 2021

(54) THERMOELECTRIC MICRO-SUPERCAPACITOR INTEGRATED DEVICE AND MANUFACTURING METHOD THEREOF

(71) Applicant: KOREA UNIVERSITY RESEARCH AND BUSINESS FOUNDATION, Seoul (KR)

(72) Inventors: Sang Sig Kim, Seoul (KR); Kyoung Ah Cho, Seoul (KR); Kyung Whan Yang, Suwon-si (KR)

(73) Assignee: Korea University Research and Business Foundation, Seoul (KR)

( * ) Notice: Subject to any disclaimer, the term of this patent is extended or adjusted under 35 U.S.C. 154(b) by 59 days.

(21) Appl. No.: 16/177,692

(22) Filed: Nov. 1, 2018

(65) Prior Publication Data
US 2019/0237509 A1  Aug. 1, 2019

(30) Foreign Application Priority Data
Jan. 31, 2018  (KR) .................. 10-2018-0012419

(51) Int. Cl.
| | |
|---|---|
| *H01L 35/34* | (2006.01) |
| *H01L 35/32* | (2006.01) |
| *H01L 27/16* | (2006.01) |
| *H01L 49/02* | (2006.01) |

(52) U.S. Cl.
CPC ............. *H01L 27/16* (2013.01); *H01L 28/60* (2013.01); *H01L 35/32* (2013.01); *H01L 35/34* (2013.01)

(58) Field of Classification Search
None
See application file for complete search history.

(56) References Cited

U.S. PATENT DOCUMENTS

| | | | |
|---|---|---|---|
| 2005/0161072 A1* | 7/2005 | Esser | H01L 35/02 136/205 |
| 2010/0142307 A1 | 6/2010 | Sartore | |
| 2015/0103469 A1* | 4/2015 | Lee | H01G 11/52 361/502 |

FOREIGN PATENT DOCUMENTS

| | | |
|---|---|---|
| JP | 2014-127186 A | 7/2017 |
| KR | 10-2016-0031147 A | 3/2016 |

OTHER PUBLICATIONS

Amponsah Kyeremateng et al. "Microsupercapacitors as miniaturized energy storage components for on-chip electronics" Nature nanotechnology | vol. 12 | Jan. 2017 | www.nature.com/naturenanotechnology (Year: 2017).*

(Continued)

*Primary Examiner* — Magali P Slawski
(74) *Attorney, Agent, or Firm* — NSIP Law

(57) ABSTRACT

The present invention provides a thermoelectric micro-supercapacitor integrated device comprising: a thermoelectric power generation module comprising a thermoelectric unit body including a thermoelectric channel interposed between two different heat sources and disposed on a substrate, the thermoelectric channel being composed of an n-type or p-type semiconductor; and a micro-supercapacitor module configured to be operated in cooperation with the thermoelectric power generation module and including a pair of collector electrodes between which an electric potential difference is generated through the thermoelectric channel.

11 Claims, 17 Drawing Sheets

(56) References Cited

OTHER PUBLICATIONS

Hargrave's Communications Dictionary (thin film. (2001). In F. Hargrave, Hargrave's Communications Dictionary, Wiley. Wiley. Credo Reference: https://search.credoreference.com/content/entry/hargravecomms/thin_film/0?institutionId=743) (Year: 2001).*

Mario Culebras Rubio "Thermoelectric devices and supercapacitors based on nanostructured semiconducting polymers for energy production and storage" Universitat de València, PhD Program 3056 Química, Feb. 2017 (Year: 2017).*

Korean Notice of Allowance dated Feb. 19, 2020 in counterpart Korean Patent Application No. 10-2018-0012419 (2 pages in Korean).

Korean Office Action dated Jun. 26, 2019 in counterpart Korean Patent Application No. 10-2018-0012419 (4 pages in Korean).

\* cited by examiner

THERMOELECTRIC MICRO-SUPERCAPACITOR INTEGRATED DEVICE AND MANUFACTURING METHOD THEREOF

CROSS-REFERENCE TO RELATED APPLICATIONS

This application claims the benefit of Korean Patent Application No. 10-2018-0012419, filed on Jan. 31, 2018, in the Korean Intellectual Property Office, which is incorporated herein by reference in its entirety.

BACKGROUND OF THE INVENTION

1. Field of the Invention

The present invention relates to energy conversion and storage. More specifically, the present invention relates to a thermoelectric micro-supercapacitor integrated device constituting an energy conversion and storage integrated system which can convert heat energy easily acquired in real life into electrical energy, store the converted electrical energy, and use the stored electrical energy as a power source for an electronic device, and to a manufacturing method thereof.

2. Description of Related Art

In general, a thermoelectric effect is classified into Peltier effect that is used in cooling applications using a temperature difference between both ends of a material, formed by electric current applied from the outside by a reversible, direct energy conversion between heat and electricity, and Seebeck effect that is used in power generation applications using an electromotive force generated due to the temperature difference between both ends of the material.

A thermoelectric cooling technology employing the Petier effect is an environmentally friendly cooling technology which does not use a refrigerant gas inducing environmental problems, and furthermore is advantageous in that it has low vibration and low noise. In addition, the thermoelectric cooling technology has a possibility that its application range will be extended up to general purpose cooling applications when the development of a high-efficiency thermoelectric cooling material will be completed within the next several years.

Further, a thermoelectric power generation technology employing the Seebeck effect is a technology in which when a thermoelectric power generation material is applied to an automotive engine, a heat dissipation apparatus, or a corresponding section on an industrial site, power generation is performed by the temperature difference between both ends of the material. Such a thermoelectric power generation system has been already applied to a remote space probe that cannot perform solar power generation.

The thermoelectric power generation module is a circuit that is designed to allow electric current to flow by a thermal electromotive force generated when p-type and n-type semiconductors are connected to set one side as a high-temperature heat source and set the other side as a lower-temperature heat source.

In recent years, the development of a variety of thermoelectric power generation modules for achieving miniaturization and compactness of the thermoelectric power generation module as mentioned above is in progress.

However, such a thermoelectric device technology that is well-known in the art involves considerable difficulty in converting irregular micro heat energy generated in real daily life into electrical energy and storing the converted electrical energy.

SUMMARY OF THE INVENTION

The present invention has been made to solve the above-mentioned problems associated with the prior art, and it is an object of the present invention to provide a power source of the type which maximizes the actual utilization by converting micro heat energy that can be generated irregularly in daily life at room temperature into electrical energy and storing the converted micro heat energy.

In other words, the object of the present invention is to provide an integrated device which converts micro heat energy into electrical energy using a micro type thermoelectric power generation module, and stores the converted electrical energy in a micro-supercapacitor module so that the stored electrical energy can be outputted so as to be utilized as an electronic device power source, unlike a conventional technology making it impossible to convert micro heat energy into stable electrical energy and store the converted electrical energy.

To achieve the above objects, the present invention provides a thermoelectric micro-supercapacitor integrated device comprising: a thermoelectric power generation module comprising a thermoelectric unit body including a thermoelectric channel interposed between two different heat sources and disposed on a substrate, the thermoelectric channel being composed of an n-type or p-type semiconductor; and a micro-supercapacitor module configured to be operated in cooperation with the thermoelectric power generation module and including a pair of collector electrodes between which an electric potential difference is generated through the thermoelectric channel.

In the thermoelectric micro-supercapacitor integrated device, the thermoelectric unit body of the thermoelectric power generation module may include: a high-temperature electrode disposed on the substrate so as to be positioned at a high-temperature side heat source of the two heat sources; a pair of low-temperature electrodes disposed on the substrate so as to be positioned at a low-temperature side heat source of the two heat sources, the low-temperature electrodes being spaced apart from the high-temperature electrode; a p-type thermoelectric channel configured to connect the high-temperature electrode and the low-temperature electrodes to each other and composed of a p-type semiconductor, and an n-type thermoelectric channel configured to connect the high-temperature electrode and the low-temperature electrodes to each other and composed of an n-type semiconductor, the n-type thermoelectric channel being disposed spaced apart from the p-type thermoelectric channel.

In the thermoelectric micro-supercapacitor integrated device, the micro-supercapacitor module may be connected to each of both ends of the low-temperature electrodes.

In the thermoelectric micro-supercapacitor integrated device, each of the pair of collector electrodes may be connected at one end thereof to an associated one of the pair of low-temperature electrodes, the collector electrodes being disposed spaced apart from each other. The micro-supercapacitor module may include: a pair of opposed supercapacitor collectors connected at one ends thereof to the pair of collector electrodes and disposed spaced apart from each other; and a dielectric layer disposed on the supercapacitor collectors.

In the thermoelectric micro-supercapacitor integrated device, the supercapacitor collectors may be stackedly disposed on the low-temperature electrodes and the high-temperature electrode when viewed vertically from above the substrate.

In the thermoelectric micro-supercapacitor integrated device, the micro-supercapacitor module may include an rGO (reduced graphene oxide) active electrode disposed on the supercapacitor collector.

In the thermoelectric micro-supercapacitor integrated device, the supercapacitor collectors, the rGO active electrode, and the dielectric layer may be stacked in plural layers, and the supercapacitor collectors may be vertically stacked and connected.

In the thermoelectric micro-supercapacitor integrated device, the thermoelectric unit body may be provided in plural numbers in such a manner as to be continuously arranged spaced apart from one another, and the micro-supercapacitor module may further include a connection collector configured to connect the supercapacitor collectors for the thermoelectric unit body.

In the thermoelectric micro-supercapacitor integrated device, the thermoelectric unit body may be configured such that the pair of low-temperature electrodes, the high-temperature electrode, the p-type thermoelectric channel, and the n-type thermoelectric channel are connected in series with each other.

In the thermoelectric micro-supercapacitor integrated device, the thermoelectric unit body of the thermoelectric power generation module may include a thermoelectric channel interposed between the two heat sources and composed of an n-type or p-type semiconductor, and the micro-supercapacitor module may further include a dielectric layer interposed between the collector electrode and the n-type thermoelectric channel.

In the thermoelectric micro-supercapacitor integrated device, the micro-supercapacitor module may include an rGO (reduced graphene oxide) active electrode disposed between the n-type thermoelectric channel and the dielectric layer.

Effects of the Invention

The thermoelectric micro-supercapacitor integrated device according to the present invention as constructed above has the following effects.

The thermoelectric micro-supercapacitor integrated device enables the storage of sustainable energy of a certain level or higher compared to a conventional energy generation/storage apparatus. It also enables the implementation of an energy generation device integrated system which can convert micro heat energy into electrical energy, and store the converted heat energy in the micro supercapacitor module or immediately use the converted heat energy even in a thermally unequal state in which the magnitude of heat energy generated from an real environment or the human body is extremely small and irregular, and there is a temperature difference of approximately 1° C., by overcoming many restrictions resulting from the surrounding environments in a room temperature state.

In other words, the thermoelectric micro-supercapacitor integrated device and the manufacturing method thereof of the present invention as described constructed is provided with the thermoelectric channel so that the manufacturing process and structure of the thermoelectric power generation module of the thermoelectric micro-supercapacitor integrated device can be simplified.

In addition, the thermoelectric micro-supercapacitor integrated device and the manufacturing method thereof of the present invention achieves a structure in which the thermoelectric power generation module of the thermoelectric micro-supercapacitor integrated device is continuously arranged in plural numbers on a plane, and simultaneously takes a continuous connection structure of the corresponding micro supercapacitor module, so that a predetermined required power can be acquired, used and stored even under the room temperature environments with irregular and minute heat temperature difference, and thus substantial thermoelectric power generation and harvesting can ultimately be implemented under the room temperature.

Moreover, the micro supercapacitor modules of the thermoelectric micro-supercapacitor integrated device of the present invention has a structure in which the micro supercapacitor modules are vertically stacked and horizontally continuously arranged by the connection connectors so that energy storage performance can be maximized by the implementation of a large area.

In other words, the thermoelectric micro-supercapacitor integrated device of the present invention includes a micro supercapacitor module that can store power amplified to a level n-fold higher than that of a cell connected with one supercapacitor through an array in which n supercapacitors vertically stacked to correspond to one thermoelectric power generation module, and realizes a structure in which m arrays including each thermoelectric power generation module corresponding to the micro supercapacitor module in which the n supercapacitors are connected are connected in series to each other through the connection collectors so that an integrated device capable of storing/outputting power amplified to a level m×n-fold higher than that of a cell connected with one supercapacitor. In addition, the parallel array of the thermoelectric power generation module and the micro supercapacitor module is composed of a horizontal structure, and the series connection of the supercapacitor arrays in the micro supercapacitor module is composed of a stacking structure so that a maximum power output per area and volume can be generated.

BRIEF DESCRIPTION OF THE DRAWINGS

The above and other objects, features and advantages of the present invention will be apparent from the following detailed description of the preferred embodiments of the invention in conjunction with the accompanying drawings, in which.

DESCRIPTION OF THE PREFERRED EMBODIMENTS

Figure 1:
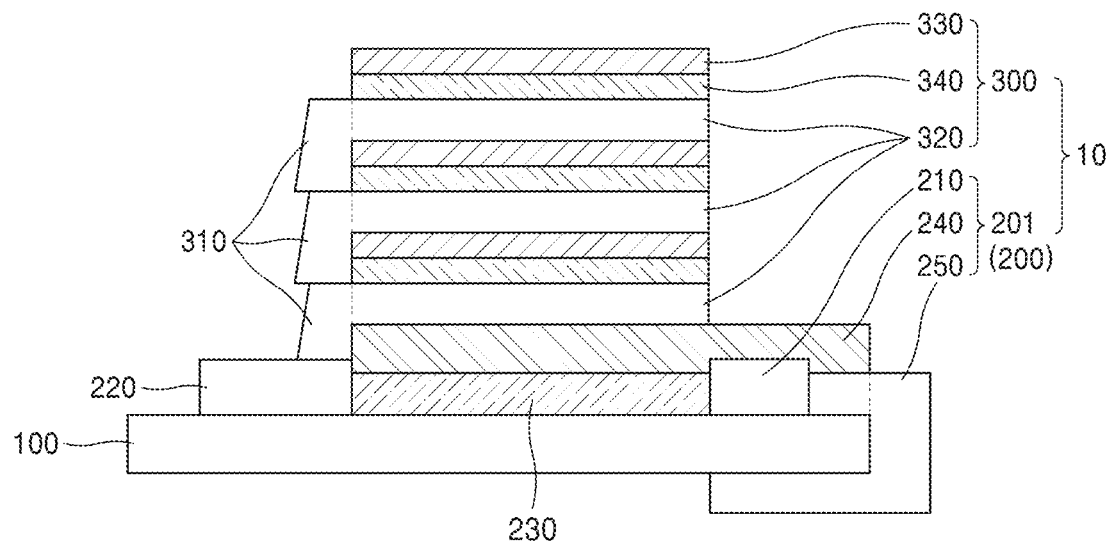
FIG. 1 is a partial cross-sectional view illustrating a thermoelectric micro-supercapacitor integrated device according to one embodiment of the present invention.
Figure 2:
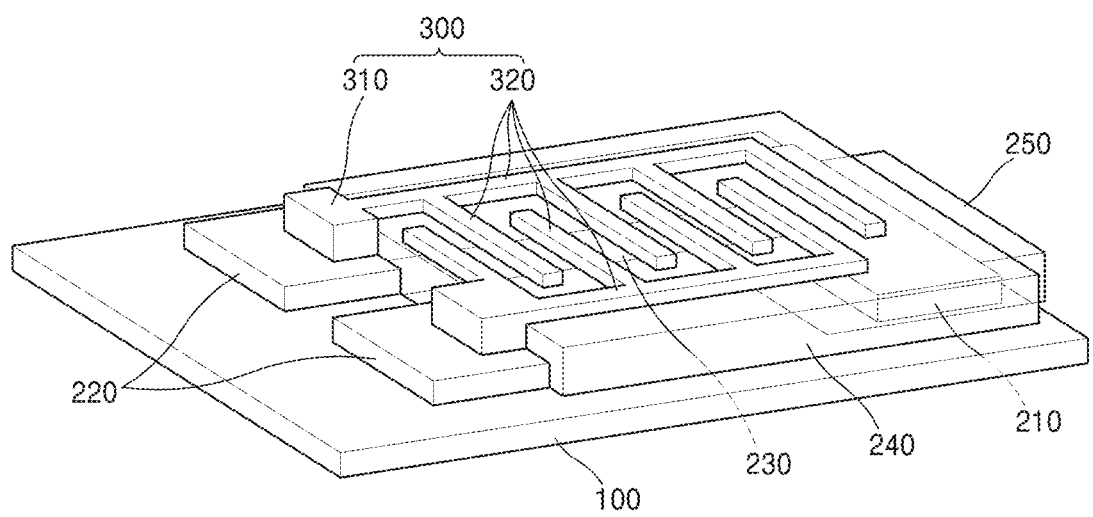
FIGS. 2 and 3 are schematic partial perspective and side cross-sectional views illustrating a thermoelectric power generation module of a thermoelectric micro-supercapacitor integrated device according to one embodiment of the present invention.
Figure 3:
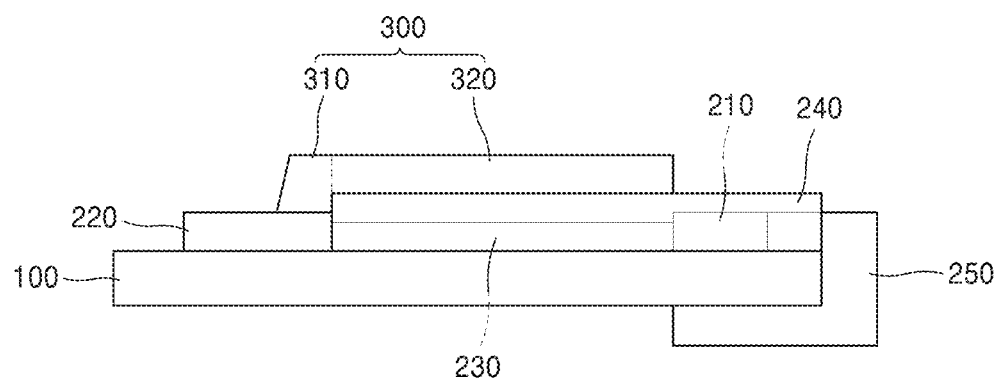
Figure 4:
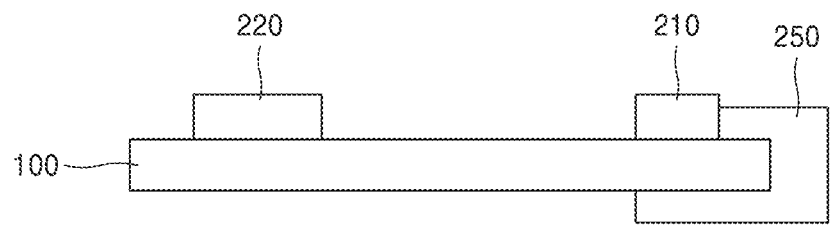
FIGS. 4 to 18 are partial side cross-sectional and top plan views illustrating a process of manufacturing a thermoelectric micro-supercapacitor integrated device according to one embodiment of the present invention.
Figure 5:
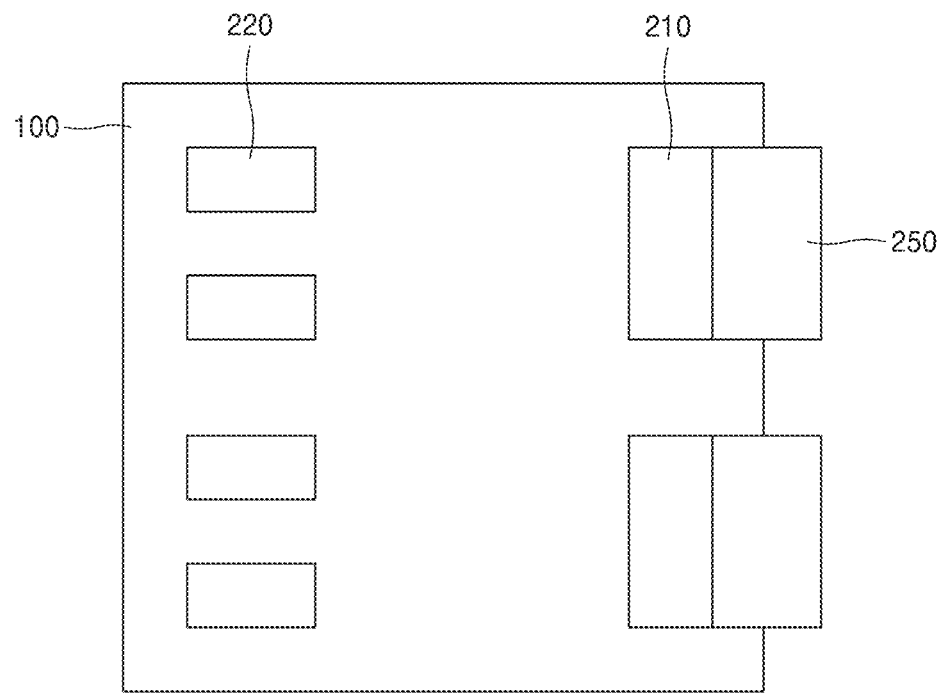

Now, the configuration of a thermoelectric micro-supercapacitor integrated device and a manufacturing method thereof according to the preferred embodiments of the present invention will be described hereinafter in detail with reference to the accompanying drawings.

The drawings to be provided below are provided by way of example so that the idea according to the present invention can be sufficiently transferred to those skilled in the art to which the present invention pertains. Therefore, the present invention is not limited to the drawings presented below, and may be embodied in other forms.

In addition, unless otherwise defined, all technical terms and scientific terms as used herein have the same meanings as those generally understood by those skilled in the art to which the present invention pertains. In the following description and the accompanying drawings, the detailed description on known related functions and constructions will be omitted to avoid unnecessarily obscuring the subject matter of the present invention hereinafter.

A thermoelectric micro-supercapacitor integrated device 10 according to the present invention can be disposed at two different heat sources (TH and TL). The thermoelectric micro-supercapacitor integrated device 10 of the present invention is interposed between two heat sources (TH and TL) where a temperature difference exists so that electrical energy converted from heat energy due to the temperature difference between the two heat sources can be stored. The thermoelectric micro-supercapacitor integrated device 10 of the present invention provides a structure of storing micro heat energy captured by a minute temperature difference. Although it has been illustrated in this embodiment that the stacking height of the structure is formed in a dimension higher than that of a plane, this is merely an example for describing the present invention and the aspect ratio or the like of a constituent element is not limited to a drawing scale.

First, the thermoelectric micro-supercapacitor integrated device 10 of the present invention is interposed between two different heat sources, and includes a thermoelectric power generation module 200 disposed on a substrate 100 and a micro-supercapacitor module 300.

The substrate 100 is disposed between two heat sources with different heat temperatures. The substrate 100 may be a flexible substrate, a glass substrate, or a silicon wafer, and can be selected variously within a range of achieving a predetermined base substrate function depending on use environments and requirements.

The thermoelectric power generation module 200 is disposed on the substrate 100, and each of the heat sources with different heat temperatures include a high-temperature heat source (TH) and a low-temperature heat source (TL).

The thermoelectric power generation module 200 includes a plurality of thermoelectric unit bodies 201 disposed on the substrate 100. The plurality of thermoelectric unit bodies 201 are electrically connected to each other by a method which will be described below to form a predetermined series connection structure, so that the series connection structure can serve as an output electrode to collect and utilize sufficient power through micro electric potential acquired from the thermoelectric power generation module 200 between two different heat sources.

Each of the plurality of thermoelectric unit bodies 201 of the thermoelectric power generation module 200 includes a high-temperature electrode 210, a low-temperature electrode 220, and a thermoelectric channel 230 (230n, 230p). The plurality of thermoelectric unit bodies 201 of the thermoelectric power generation module 200 is disposed on the substrate 100.

The high-temperature electrode 210 and the low-temperature electrode 220 are formed of a conductive material that smoothly achieves the heat transfer with the high-temperature heat source TH and the low-temperature heat source TL at both sides thereof. The high-temperature electrode 210 and the low-temperature electrode 220 of the thermoelectric unit body 201 are disposed in plural numbers on the substrate 100 in such a manner as to be spaced apart from each other at predetermined intervals.

The high-temperature electrode 210 and the low-temperature electrode 220 serving as heat source electrodes can be formed in various manners, such as being formed by depositing a conductive layer with good electrical conductivity through a known vacuum thermal evaporation process or a sputter deposition process, or a separate conductive paste printing technique.

In some cases, the thermoelectric unit body 201 may include an electrode extension part 250 for further smoothly performing the heat transfer of the high-temperature electrode 210. The electrode extension part 250 may be formed of the same material as that of the high-temperature electrode 210, and various modifications thereto can be made such as being formed of a material that further maximizes the thermal conductivity. The electrode extension part 250 is connected at one end thereof to one end of the high-temperature electrode 210 and disposed at the other end thereof at the high-temperature heat source TH at the outside of the high-temperature electrode 210, so that the effect of collecting heat from the external high-temperature heat source TH can be enhanced, and thus a function of receiving and collecting heat from the heat source can be performed smoothly.

The electrode extension part 250 may have a configuration which maximizes the surface area thereof to increase the heat collection effect. In this embodiment, the high-temperature electrode 210 is formed adjacent to one end of the substrate 100, and the electrode extension part 250 performs a function of a thermal conductor such as the extension formation of the high-temperature electrode 210. The electrode extension part 250 may be disposed such that it abuts at one end thereof against the high-temperature electrode 210 and is formed extending from one side surface of the substrate 100 to a lower end of the other surface of the substrate 100. By virtue of this configuration, the heat collection function can be performed more smoothly and easily.

In the meantime, the thermoelectric channels 230 (230n, 230p) are disposed on the substrate 100 so as to be spaced apart from one another and constitute each thermoelectric unit body 201. A thermoelectric channel 230 (230n, 230p) is disposed between the high-temperature electrode 210 and the low-temperature electrode 220. The thermoelectric channel 230 (230n, 230p) includes an n-type thermoelectric channel 230n and a p-type thermoelectric channel 230p.

A material in the thermoelectric channel is not limited to a compound semiconductor, but may include an inorganic material such as silicon and oxide, as well as an organic material, a mixture thereof, and the like. In addition, a thermoelectric channel formed in various sizes including nano size and micro size depending on the size of the thermoelectric channel may be used. In addition, various selections can be made for the thermoelectric channel depending on the size and shape of a material, such as being implemented in a shape of a wire, a thin film, a bulk, or the like depending on shapes.

The n-type thermoelectric channel 230n is a thermoelectric channel composed of an n-type semiconductor, and the p-type thermoelectric channel 230p is a thermoelectric channel composed of a p-type semiconductor. The manufacture of the n-type thermoelectric channel 230n and the p-type thermoelectric channel 230p has been performed by using transfer and spin-coating methods, but this is merely an example of the manufacture and arrangement of the n-type thermoelectric channel 230n and the p-type thermoelectric channel 230p, and the n-type thermoelectric channel 230n and the p-type thermoelectric channel 230p of the present invention is not limited thereto but can be provided by various manufacture methods.

The n-type thermoelectric channel 230n and the p-type thermoelectric channel 230p of the present invention are disposed spaced apart from each other in such a manner as to be connected at one ends thereof to the high-temperature electrode 210 and connected at the other ends thereof to the low-temperature electrode 220. In this embodiment, each of thermoelectric unit bodies has a structure in which a pair of low-temperature electrodes 220, a high-temperature electrode 210, an n-type thermoelectric channel 230n, and a p-type thermoelectric channel 230p form a '⊏-shaped configuration such that the -type thermoelectric channel 230n and the p-type thermoelectric channel 230p are disposed between the high-temperature electrode 210 and the pair of opposed low-temperature electrodes 220 disposed spaced apart from each other.

In some cases, although the thermoelectric unit body may have a structure in which a plurality of high-temperature and low-temperature electrodes, and a plurality of n-type and p-type thermoelectric channels 230n and 230p are consecutively connected in series, a description will be made centering on the case where the thermoelectric unit body in this embodiment is provided in plural numbers on the substrate in such a manner as to be spaced apart from one another, where each thermoelectric unit body includes a pair of low-temperature electrodes 220, one high-temperature electrode 210, and a thermoelectric channel disposed on the substrate and composed of an n-type or p-type semiconductor, and where a plurality of thermoelectric unit bodies constitute one thermoelectric power generation module and are consecutively connected in series through a connection collector of the micro-supercapacitor module which will be described below.

A thermoelectric dielectric layer 240 is deposed between the thermoelectric power generation module 200 and the micro-supercapacitor module 300. The thermoelectric dielectric layer 240 may have a structure in which it covers the thermoelectric channel 230 and is in close contact with the outer surface of the low-temperature electrodes 210 and the high-temperature electrode 220 or at least covers end portions of the low-temperature electrodes 210 and the high-temperature electrode 220 so as to form an electrical separation structure between the thermoelectric channel 230 of the thermoelectric power generation module 200 and the micro-supercapacitor module 300. The thermoelectric dielectric layer 240 is preferably made of a heat resistant material so as to form a thermal separation structure between the thermoelectric channel 230 and the micro-supercapacitor module 300.

The micro-supercapacitor module 300 of the present invention is disposed on a top of the thermoelectric power generation module 200, more specifically the top of an at least portion of the thermoelectric power generation module 200 to form a stacking structure in which the at least portion of the thermoelectric power generation module 200 and the micro-supercapacitor module 300 are superposed with each other when projected onto a plane parallel to the substrate 100 so that a predetermined required power can be acquired and stored through a structure in which the micro-supercapacitor module 300 is stackedly formed in plural numbers in a parallel manner with respect to the thermoelectric unit bodies connected in series while minimizing the mounting area.

The micro-supercapacitor module 300 is connected to the thermoelectric power generation module 200 and is operated in cooperation with the thermoelectric power generation module 200, and includes a pair of collector electrodes 310 between which an electric potential difference is generated through the thermoelectric channel. The collector electrodes and the supercapacitor collector which will be described below are described separably for the sake of convenience in the description of this embodiment, but the collector electrodes 310 and the supercapacitor collector 320 may be modified in various manners depending on design specifications, such as being formed as an integral unitary constituent element.

The collector electrode 310 is connected at one end thereof to each of the low-temperature electrodes 220. In other words, in the case of the thermoelectric unit body consisting of one high-temperature electrode 210 and two low-temperature electrode 220 as in this description, the collector electrode 310 is separately formed at each of the two low-temperature electrodes 220 of each thermoelectric unit body. In some cases, in the case where the thermoelectric unit body has a structure in which a plurality of high-temperature electrodes and a plurality of low-temperature electrodes are connected in series, each collector electrode may have a structure in which it is connected to the low-temperature electrodes at both ends of the thermoelectric unit body.

In the meantime, the micro-supercapacitor module 300 includes a pair of opposed supercapacitor collectors 320 and a dielectric layer 330. The supercapacitor collectors 320 are connected at one ends thereof to the pair of collector electrodes 310 and are disposed spaced apart from each other. The supercapacitor collectors 320 are disposed on a plane parallel to the substrate 100. The supercapacitor collectors 320 are stacked disposed in plural pairs. The supercapacitor collectors 320 are disposed on one surface of the electrode extension part 250 and the dielectric layer 330 is stacked above the supercapacitor collector 320. The micro-supercapacitor module 300 forms a structure in which a plurality of supercapacitor collector pairs 320 are stacked on top of one another in such a manner that another pair of supercapacitor collectors 320 are formed on one surface of the dielectric layer 330 and another dielectric layer 330 is again stacked above the another pair of supercapacitor collectors 320.

Herein, the plurality of stacked supercapacitor collector pairs 320 is connected at ones thereof to the collector electrodes 310. The collector electrodes 320 are sequentially stacked formed and connected with respect to the stacked supercapacitor collectors 320. As mentioned above, the collector electrodes 320 may be integrally formed with the supercapacitor collectors 320, and may be modified in various manners depending on design specifications, such as being stacked formed laterally separately.

By virtue of this configuration, the collector electrodes 320 can be consecutively connected in series with the low-temperature electrodes 220, and the supercapacitor collectors 320 can be connected to the respective collector electrodes 320 to ultimately form a parallel connection structure of the respective supercapacitor collectors 320. The number of the stacked supercapacitor collectors 320 may be selected variously depending on design specifications.

In the meantime, an rGO active electrode 340 may be further disposed between the supercapacitor collector 320 of the present invention and the dielectric layer 330 disposed above the supercapacitor collector 320. The rGO active electrode 340 is formed of a reduced graphene oxide (rGO) obtained by oxidizing and reducing graphene oxide using a chemical method and a photocatalytic reaction method to exhibit its excellent intrinsic electrical properties. The rGO active electrode 340 is formed on one surface of the supercapacitor collector 320 to have a carbon-based excellent capacitance and a very rapid time-constant behavior. Although it has been described in this embodiment that the rGO active electrode 340 is formed by a method which reduces graphene oxides using the chemical method and the photocatalytic reaction method, the scope of the present invention is not limited thereto.

The collector electrodes 310 connected to the low-temperature electrodes 210, the supercapacitor collectors 320 disposed on one surface of the electrode extension part 250 of the thermoelectric power generation module 200, the rGO active electrode 340 disposed on one surface of the collector electrodes 310 and the supercapacitor collectors 320 or on at least one surface of the collector electrodes 310, and the dielectric layer 330 disposed to cover a layer forming the pair of spaced-apart supercapacitor collectors 320 and the rGO active electrode 340 constitute a single micro-capacitor unit body, and one or more micro-capacitor unit bodies may be vertically stacked on the top of the single micro-capacitor unit body. In other words, as mentioned above, a plurality of vertically stacked micro-capacitor unit bodies 301 establish a parallel connection structure through the respective collector electrodes 310, and may have a structure in which they are vertically arranged in parallel with one another.

Meanwhile, the thermoelectric micro-supercapacitor integrated device 10 of the present invention enables the thermoelectric unit body to be disposed in plural numbers so as to acquire a predetermined required power as described above, and may have a structure in which the respective thermoelectric unit bodies on which a plurality of supercapacitor collectors are stacked are connected in series with one another through a plurality of connection collectors 350. In other words, the plurality of supercapacitor collectors are vertically stacked formed on the top of the respective thermoelectric unit bodies, the respective supercapacitor collectors 320 are connected to the collector electrodes 310, and the respective thermoelectric unit bodies are disposed spaced apart from one another on the substrate. In this case, the connection collectors 350 are connected to each other in such a manner as to be in close contact with the collector electrodes 310 or the supercapacitor collectors 320 of the micro-capacitor unit bodies formed on two adjacent thermoelectric unit bodies. The connection collectors 350 may be formed in various manners depending on the design and manufacture specifications required, but the connection collectors 350 in this embodiment will be described centering on the case where the connection collectors 340 are formed simultaneously with the collector electrodes and the supercapacitor collectors on the uppermost layer when forming the micro-capacitor unit bodies.

The connection collector 350 in this embodiment is formed simultaneously formation of the collector electrodes and the supercapacitor collector on the uppermost layer of the micro-capacitor unit body. The connection collector 350 is configured such that a plurality of micro-capacitor unit bodies vertically stacked and connected in parallel with one another on the top of the continuously spaced-apart thermoelectric unit bodies are connected in series with adjacent micro-capacitor unit bodies. As shown in the drawings, the dielectric layers disposed above the vertically stacked supercapacitor collectors are continuously formed above a plurality of thermoelectric unit bodies, and the connection collector 350 can be disposed at a region between the two spaced-apart adjacent thermoelectric unit bodies to establish a series connection structure of the micro-capacitor unit bodies with respect to the thermoelectric unit bodies adjacent to each other. Although not shown in this embodiment, the connection collector 350 may be modified in various manners, such as having a separate switching device connected to the connection collectors 350.

Hereinafter, a process of manufacturing the thermoelectric micro-supercapacitor integrated device described in the previous embodiment will be described with reference to the drawings.

First, a pair of low-temperature electrodes 210 and a high-temperature electrode 220 are formed on one surface of the substrate 100.

After the substrate 100 has been prepared, a heat source electrode formation step is performed in which the low-temperature electrodes 210 and the high-temperature electrode 220 are formed. In other words, the low-temperature electrode 210 and the high-temperature electrode 220 as heat source electrodes disposed at the heat source are formed on one surface of the substrate 100. The low-temperature electrode 210 and the high-temperature electrode 220 are may be formed by various methods, such as being formed by being subjected to a separate deposition process using a lithography technique or by a patterned printing technique. In addition, the electrode extension part 250 as described above may further provided, if necessary, and thus a constituent element that maximizes the heat transfer area may further be created.

The electrode extension part 250 for more smoothly performing the heat transfer of an electrode, particularly the high-temperature electrode 210 may further be provided. The electrode extension part 250 is connected at one end thereof to one end of the high-temperature electrode 210 and disposed at the other end thereof at the high-temperature heat source TH at the outside of the high-temperature electrode 210, so that the effect of collecting heat from the external high-temperature heat source TH can be enhanced, and thus a function of receiving and collecting heat from the heat source can be performed smoothly.

The electrode extension part 250 may have a configuration which maximizes the surface area thereof to increase the heat collection effect. In this embodiment, the high-temperature electrode 210 is formed adjacent to one end of the substrate 100, and the electrode extension part 250 performs a function of a thermal conductor such as the extension formation of the high-temperature electrode 210. The electrode extension part 250 may be disposed such that it abuts at one end thereof against the high-temperature electrode 210 and is formed extending from one side surface of the substrate 100 to a lower end of the other surface of the substrate 100. By virtue of this configuration, the heat collection function can be performed more smoothly and easily.

Figure 6:
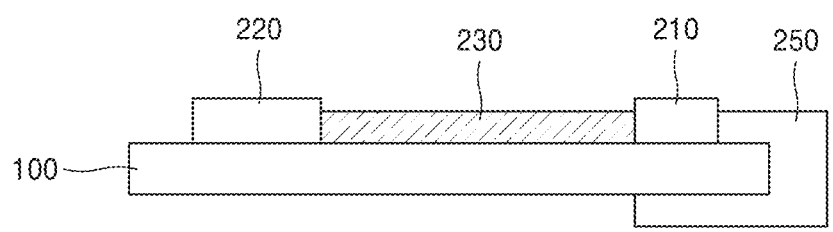
Figure 7:
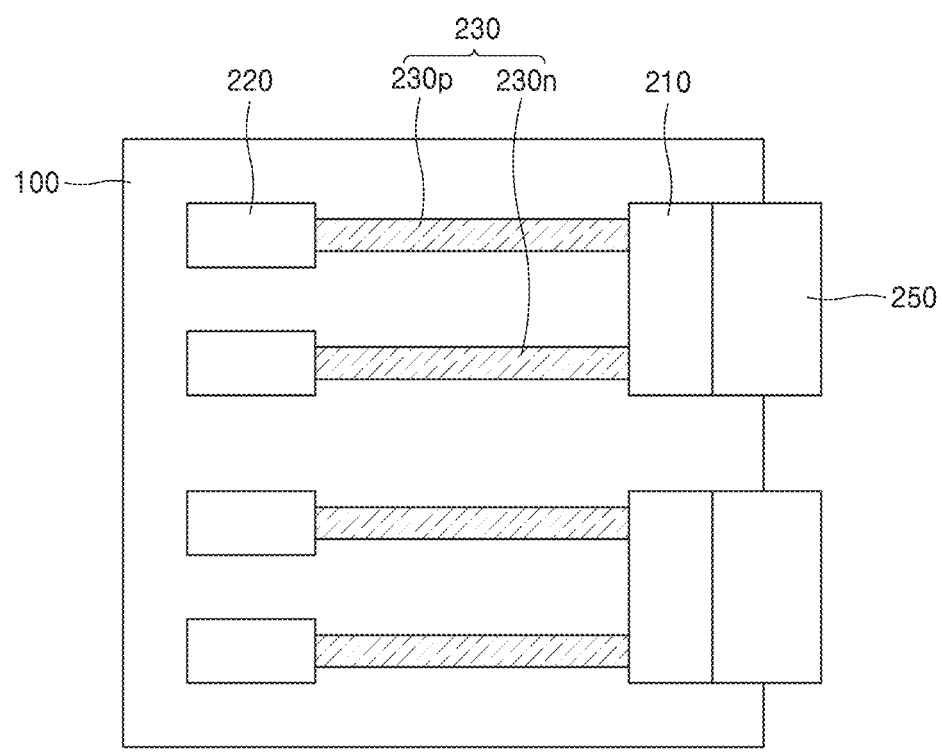
Figure 8:
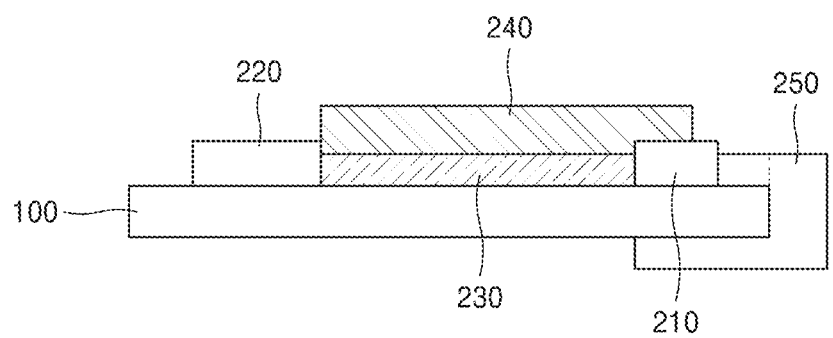
Figure 9:
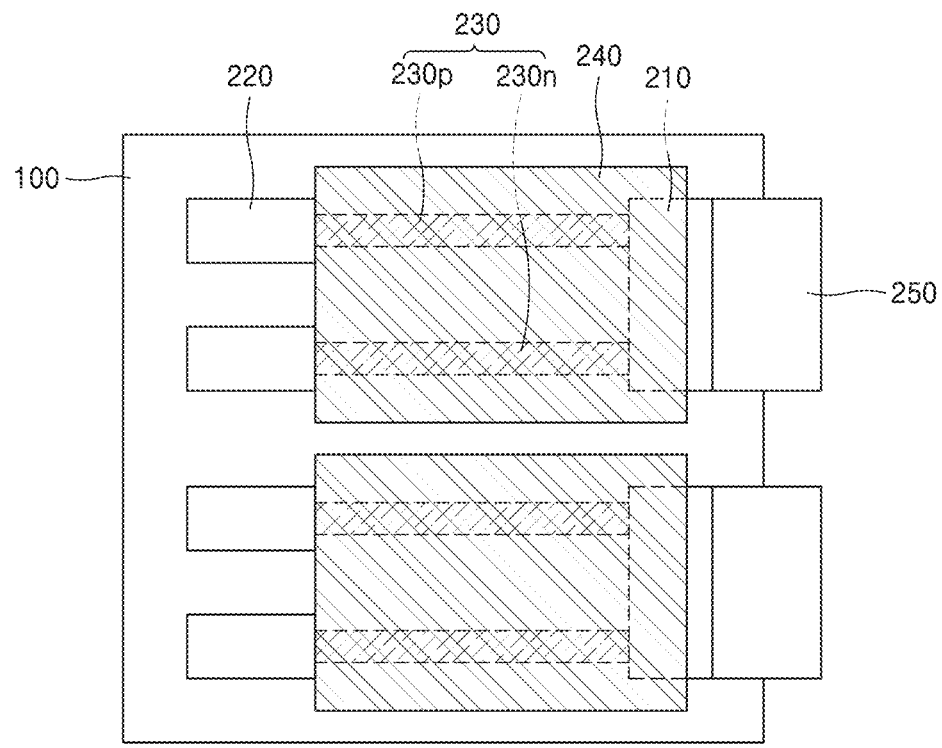

Thereafter, as shown in FIG. 6, a thermoelectric channel formation step is performed in which the thermoelectric channel 230 (230p, 230n) constituting the thermoelectric unit body 201 of the thermoelectric power generation module 200 is formed. In this step, an n-type thermoelectric channel 230n and a p-type thermoelectric channel 230p are continuously disposed spaced apart from each other in the longitudinal direction between the low-temperature electrodes and the high-temperature electrode while forming a pair.

The n-type thermoelectric channel 230n and the p-type thermoelectric channel 230p may be formed on the substrate 100 in a transfer manner. The n-type thermoelectric channel 230n and the p-type thermoelectric channel 230p, which are formed in the transfer manner, are connected to the low-temperature electrodes 210 and the high-temperature electrode 220.

After the thermoelectric channel formation step has been completed, a thermoelectric dielectric layer formation step is performed in which a thermoelectric dielectric layer 240 as a protective layer is formed on the thermoelectric unit body 201 of the thermoelectric power generation module 200. The formation of the thermoelectric dielectric layer can be performed by a layer stacking technique including lithography, etching or the like.

As described above, the thermoelectric dielectric layer 240 may have a structure in which it covers the thermoelectric channel 230 and is in close contact with the outer surface of the low-temperature electrodes 210 and the high-temperature electrode 220 or at least covers end portions of the low-temperature electrodes 210 and the high-temperature electrode 220 so as to form an electrical separation structure and/or a thermal separation structure between the thermoelectric channel 230 of the thermoelectric power generation module 200 and the micro-supercapacitor module 300.

Figure 10:
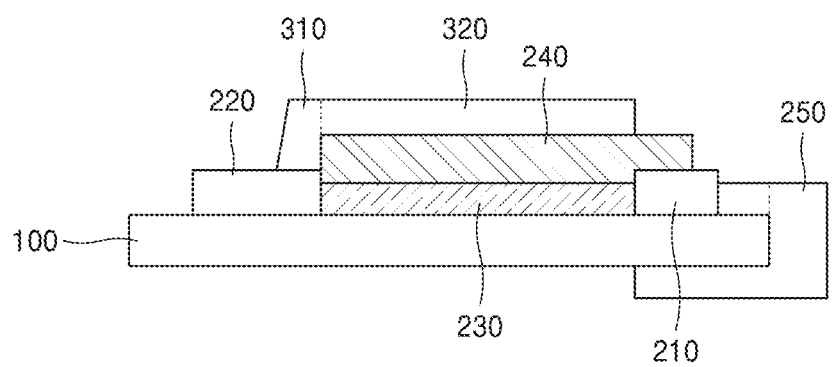
Figure 11:
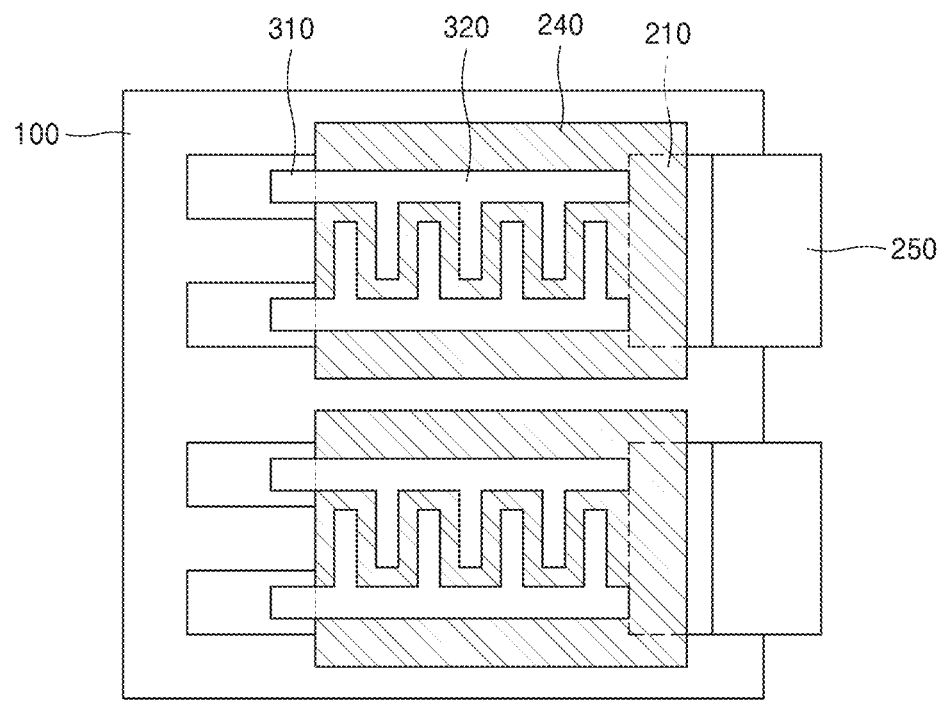

Then, a step is performed in which the micro-supercapacitor module 300 is formed on the thus formed thermoelectric power generation module 200. First, as shown in FIGS. 10 and 11, a collector formation step is performed. In the collector formation step, a pair of opposed collector electrodes 310 and a pair of opposed supercapacitor collectors 320 are formed so as to at least partially cover the thermoelectric dielectric layer 240 and to be connected to the respective low-temperature electrodes 220 through a deposition method using a lithograph technique. Although it has been described in this embodiment that the collector electrode 310 and the supercapacitor collector 320 constitute an integral unitary constituent element and are configured such that they are deposited with the same conductive material simultaneously, various modifications thereto can be made. In addition, although it has been illustrated in this embodiment that the thermoelectric power generation module and the micro-supercapacitor module are configured so as to be disposed spaced apart from each other in pairs on the substrate, the scope of the present invention is not limited thereto, but various modifications thereto can be made.

The collector electrodes 310 and the supercapacitor collectors 320, which are formed on the thermoelectric unit body of the thermoelectric power generation module 200, are disposed spaced apart from each other to form pairs. Each of the collector electrodes 310 is connected at one end thereof to each of the low-temperature electrodes 220, and connected at the other end thereof to each of the supercapacitor collectors 320.

Figure 12:
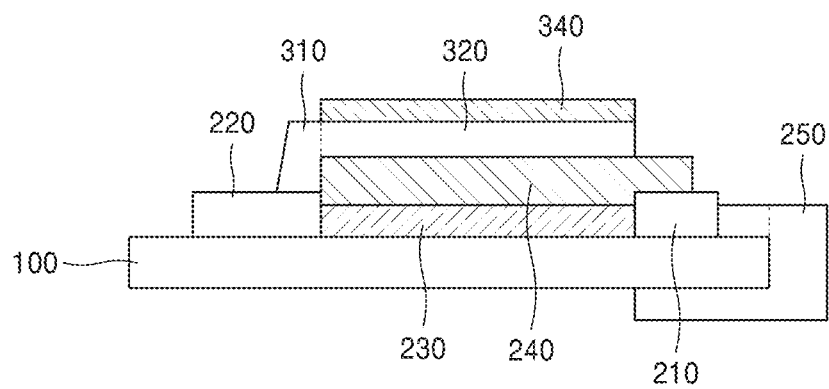
Figure 13:
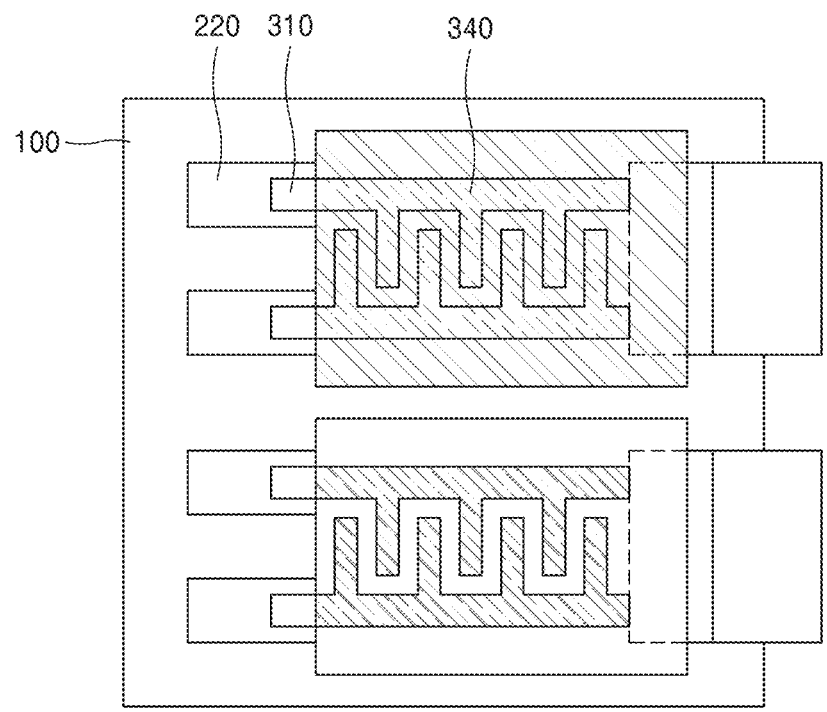
Figure 14:
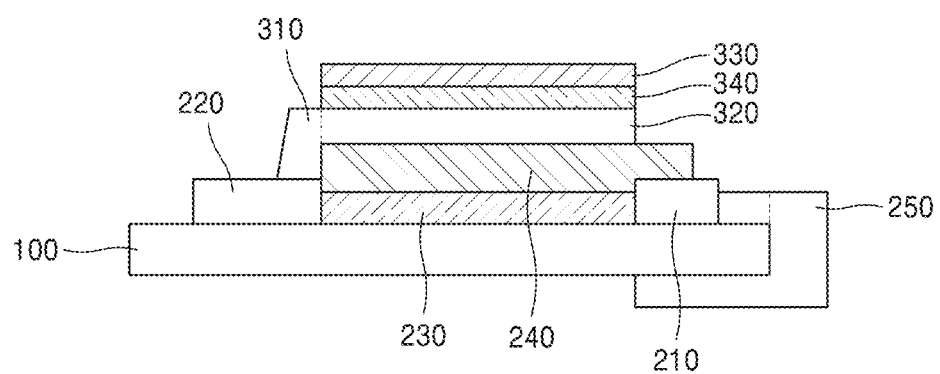
Figure 15:
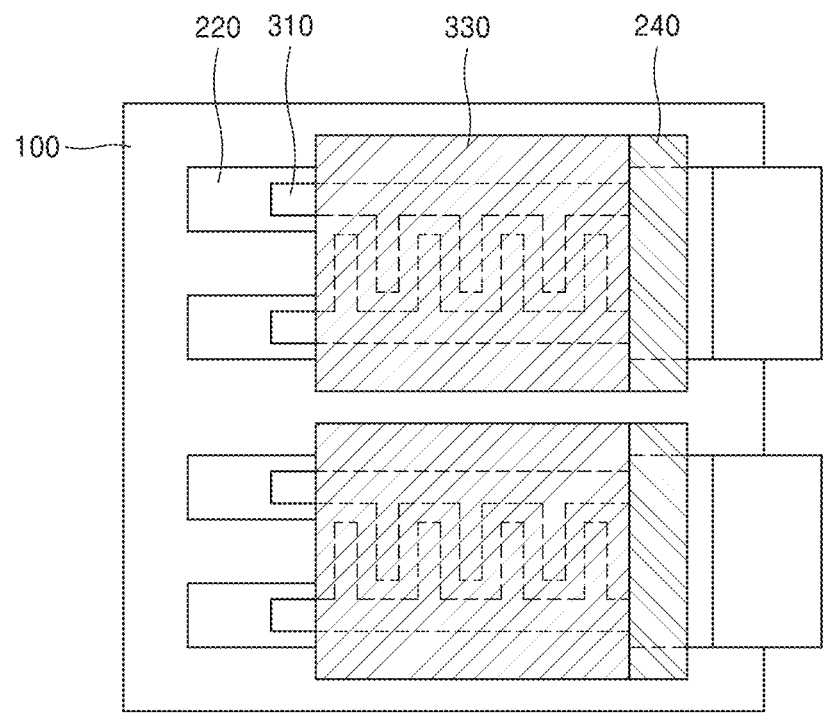
Figure 16:
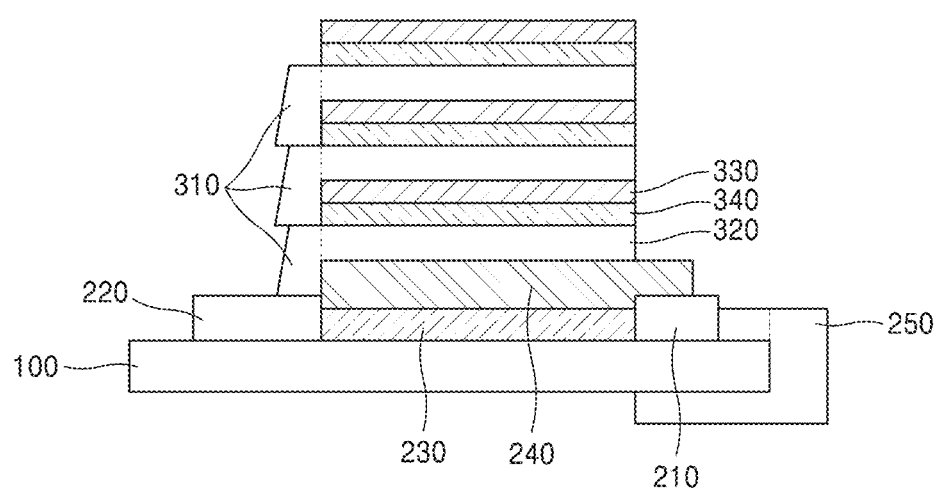
Figure 17:
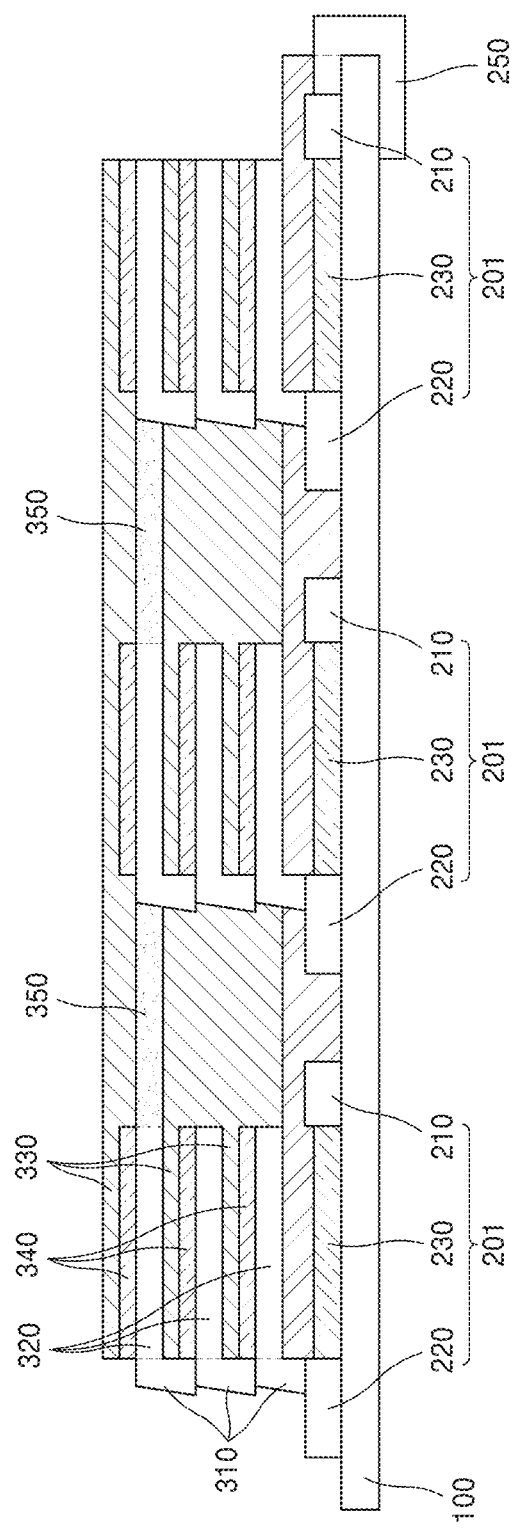
Figure 18:
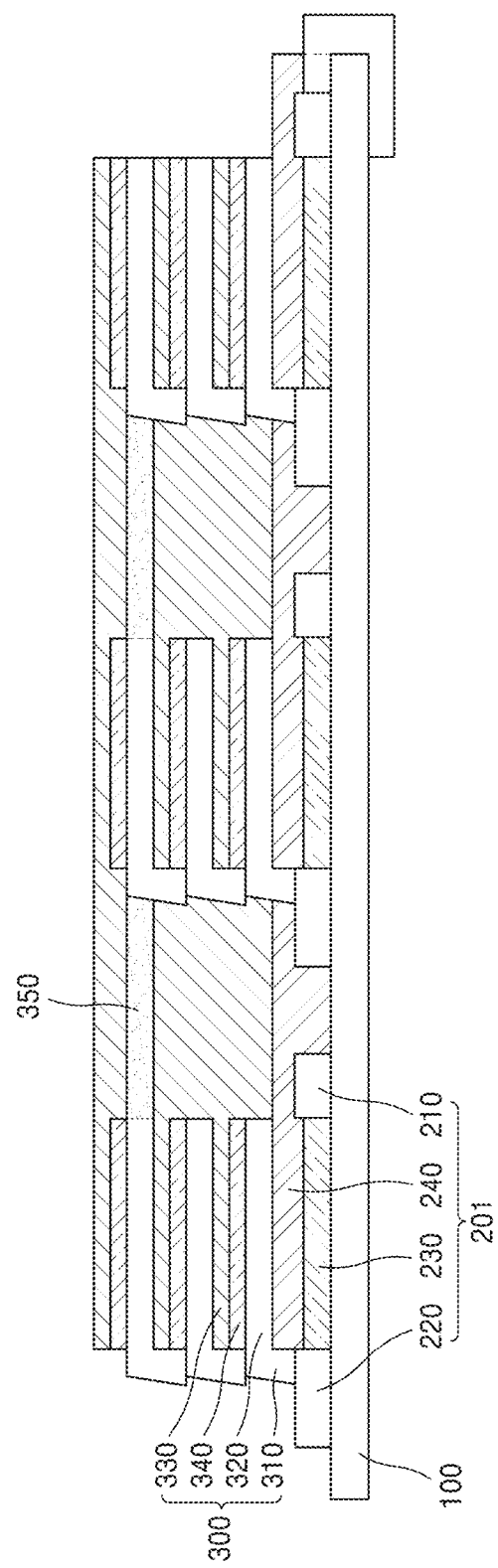
Figure 19:
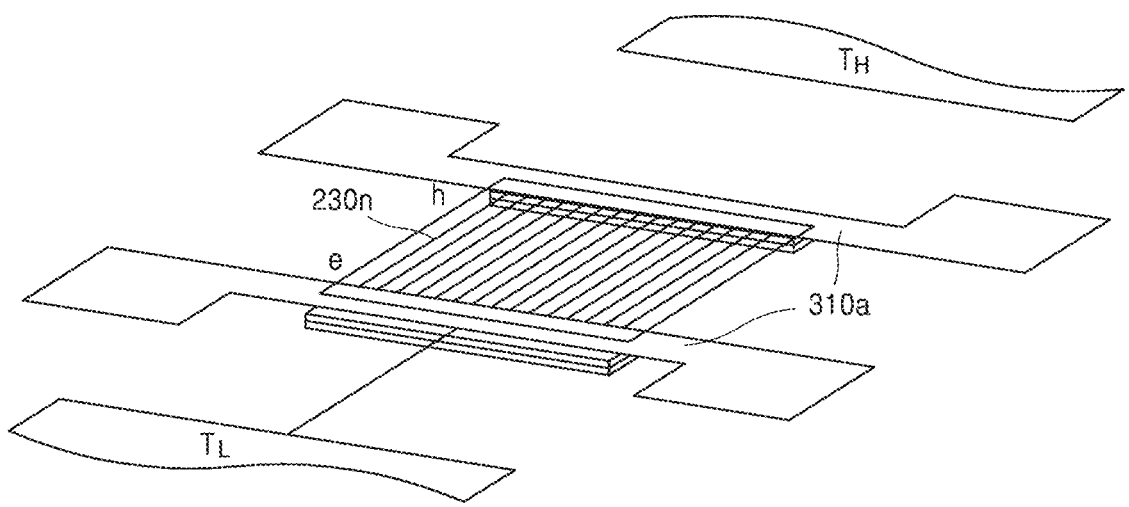
FIGS. 19 and 20 are schematic perspective and partial cross-sectional views illustrating a thermoelectric micro-supercapacitor integrated device according to another embodiment of the present invention.
Figure 20:
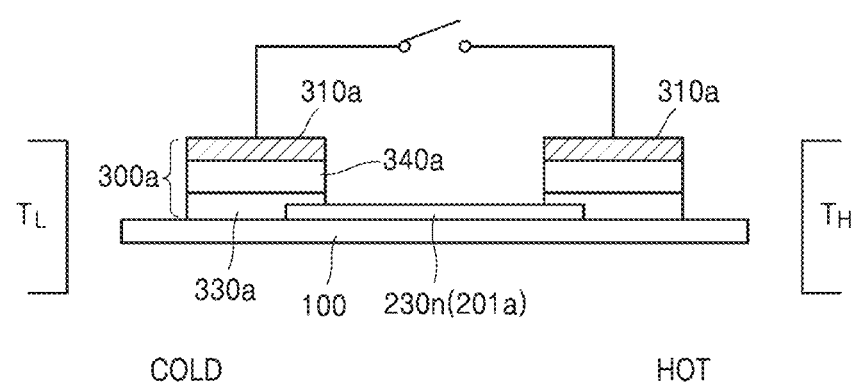

In the meantime, similar to the above-described case, after the supercapacitor collectors 320 have been formed, an rGO active electrode formation step may further be performed. In other words, as shown in FIGS. 12 and 13, in the rGO active electrode formation step, an rGO active electrode is formed on one surfaces of the supercapacitor collectors 320, which is a region patterned by the lithography process.

Thereafter, a step of forming a dielectric layer 330 is performed. The dielectric layer 330 is disposed to entirely or at least partially cover the supercapacitor collectors 320 and/or the rGO active electrode 340, and a region between the high-temperature electrode 210 and the low-temperature electrodes 220 when viewed from a plane parallel to the substrate through the patterning lithography process. In addition, the dielectric layer 330 is disposed to cover the thermoelectric dielectric layer 240 when viewed from a plane perpendicular to the substrate.

The micro-supercapacitor module 300 may have a vertical stacking structure in order to maximize the capacitor capacity per unit area when viewed from the plane parallel to the substrate. In other words, a step of forming the micro-supercapacitor module can be performed repeatedly m times to form m stacking capacitor structures. The collector formation step, the rGO active electrode formation step, and the dielectric layer 330 formation step may be performed repeatedly a required number of times stacked. However, if the collector electrode is stacked in plural numbers in the collector formation step, only the collector electrodes at the lowermost position are in direct contact with the low-temperature electrodes 220, and the collector electrodes at the upper positions are in close contact with the collector electrodes at the lower positions to ultimately form a structure in which the upper collector electrodes stacked are conductively connected to the low low-temperature electrodes 220.

Thereafter, a step is performed which forms a connection collector that horizontally interconnect one or more micro-supercapacitor modules stacked on each of the plurality of thermoelectric unit bodies of the thermoelectric power generation module. The connection collector formation step includes a step of disposing the connection collector formed of a conductive material by a thermal deposition method after being subjected to patterning through the lithography technique in the same manner as in the previous case. If the connection collector 350 disposed in the connection collector formation step is formed of the same material as that of the collector electrode, the micro-supercapacitor module 300 may have a structure in which the rGO active electrode is additionally formed on one surface of the collector electrodes that constitute the same layer together with the connection collector and the dielectric layer covers the entire area of the rGO active electrode. In addition, in some cases, the micro-supercapacitor module 300 may be configured such that a protective layer is formed on the entire area of the dielectric layer to protect the constituent elements stacked at the lower positions.

By virtue of such a process, the manufacture of a thermoelectric micro-supercapacitor integrated device can be achieved in which the thermoelectric power generation module and the micro-supercapacitor module are integrated with each other.

As described above, the thermoelectric micro-supercapacitor integrated device and the manufacturing method thereof according to one embodiment of the present invention have been discussed. Although a structure has been described in which the micro-capacitor unit body is vertically stacked on the thermoelectric unit body in the above embodiment based on a configuration in which the thermoelectric unit body includes the low-temperature electrodes, the high-temperature electrode, and the n-type and p-type thermoelectric channels disposed therebetween, the thermoelectric unit body includes only the n-type thermoelectric channel composed of an n-type semiconductor as the thermoelectric channel which is a constituent element in this embodiment, and the low-temperature electrodes/the high-temperature electrode and the supercapacitor collectors are integrally formed with one another.

In other words, as shown in the drawings, the thermoelectric unit body 201*a* of the thermoelectric power generation module of the thermoelectric micro-supercapacitor integrated device may be configured to include an n-type thermoelectric channel 230*n* as a single type thermoelectric channel, and the micro-supercapacitor module 300 may be configured to further include a dielectric layer 330*a* in another embodiment.

The single type thermoelectric channel, that is, in this embodiment, the n-type thermoelectric channel 230*n* are disposed in plural numbers in the longitudinal direction between two heat sources TH and TL, and the dielectric layer 330*a* is disposed between the two heat sources and between the collector electrodes 310*a* and the n-type thermoelectric channel 230*n*. More specifically, the n-type thermoelectric channel 230*n* is disposed in plural numbers on the substrate in the longitudinal direction between two heat sources TH and TL, the dielectric layers 330*a* are disposed spaced apart from each other between the two heat sources and are disposed to be stacked at positions of one ends of a plurality of n-type thermoelectric channels 230*n*, and a collector electrode 310*a* is disposed on the dielectric layer 330*a*. The dielectric layer 330*a* may be formed of PVA/H3PO4 polymer gel electrolyte, and may select various materials within a range of performing a function of a separator, such as being capable of being implemented as a thin film containing polystyrene sulfonic acid (PSSH).

In the case of this embodiment, the collector electrode 310*a* also includes the functions of both the high-temperature electrode and the low-temperature electrodes as in the previous embodiment, and thus does not require separate high-temperature/low-temperature electrodes so that the thermoelectric unit body can form a more simple stacking structure than that of the thermoelectric unit body in the previous embodiment.

In some cases, similarly to the previous embodiment, a micro-supercapacitor module 300*a* may further include an rGO (reduced graphene oxide) active electrode 340*a*.

In this embodiment, the rGO active electrode 340*a* is also formed of a reduced graphene oxide (rGO) obtained by reducing graphene oxide using a chemical method and a photocatalytic reaction method to exhibit its excellent intrinsic electrical properties in the same manner as that in the previous embodiment. Although it has been described in this embodiment that the rGO active electrode 340*a* is formed of a reduced graphene oxide obtained by the chemical reduction method, a method required to manufacture the rGO active electrode 340*a* may be selected variously within a range of providing the rGO active electrode 340*a* having an excellent quality. The rGO active electrodes 340*a* are disposed on the dielectric layer 330*a* with an n-type thermoelectric channel 230*n* interposed therebetween. In addition, the rGO active electrodes 340*a* is disposed between the n-type thermoelectric channel 230*n* and the collector electrode 310*a* so that a power collection function onto the collector electrode 310*a* can be further strengthened using an electric potential generated from the thermoelectric channel 230*n*.

FIGS. 21 to 24 show the operation process of a capacitor integrated device 10*a* as constructed above. First, in FIGS. 21 to 24, there is shown a diagrammatic view showing a continuous structure of the micro-supercapacitor module 300*a* and the thermoelectric power generation module 200*a* which are developed to facilitate the explanation of the operation process of the capacitor integrated device 10*a*. A plurality of n-type thermoelectric channels 230*n* are disposed between two collector electrodes 310*a* simultaneously performing the function of the heat source electrode, and a dielectric layer 330*a* is disposed between the n-type thermoelectric channel 230*n* and each of the two collector electrodes 310*a*. Although only the collector electrodes 310*a* has been illustrated in FIGS. 21 to 24 for the sake of the schematic description of the capacitor integrated device 10*a*, an rGO active electrode 340*a* may further be disposed between the collector electrode 310*a* and the dielectric layer 330*a*, which is the same as the description in the previous embodiment.

Figure 21:
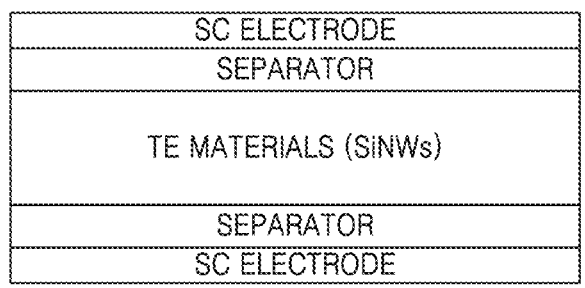
FIGS. 21 to 24 are schematic state views illustrating an operation process of a thermoelectric micro-supercapacitor integrated device according to another embodiment of the present invention.
Figure 22:
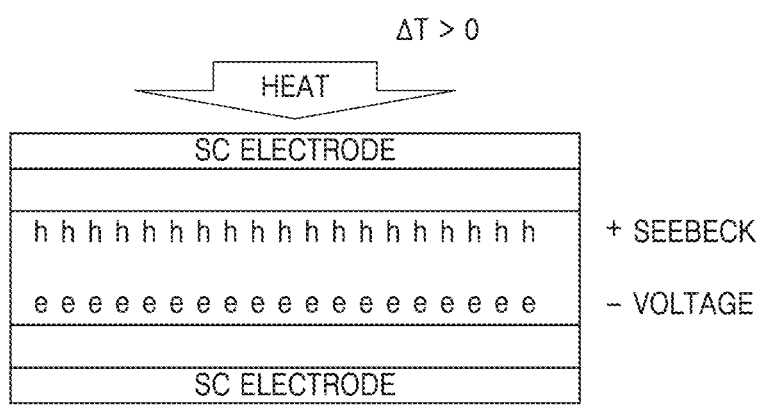
Figure 23:
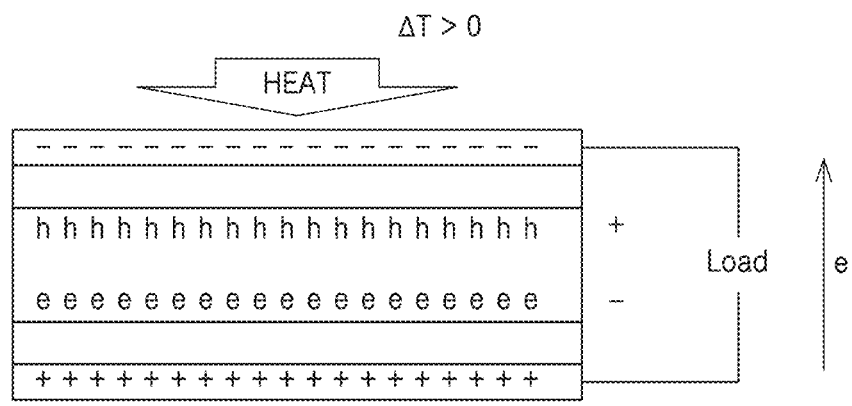
Figure 24:
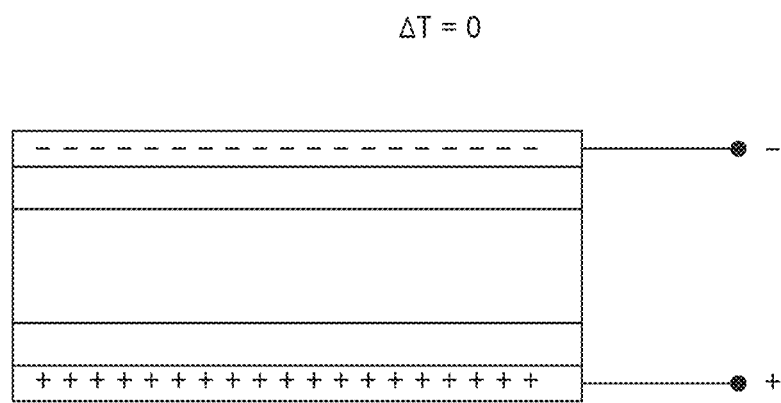
Figure 25:
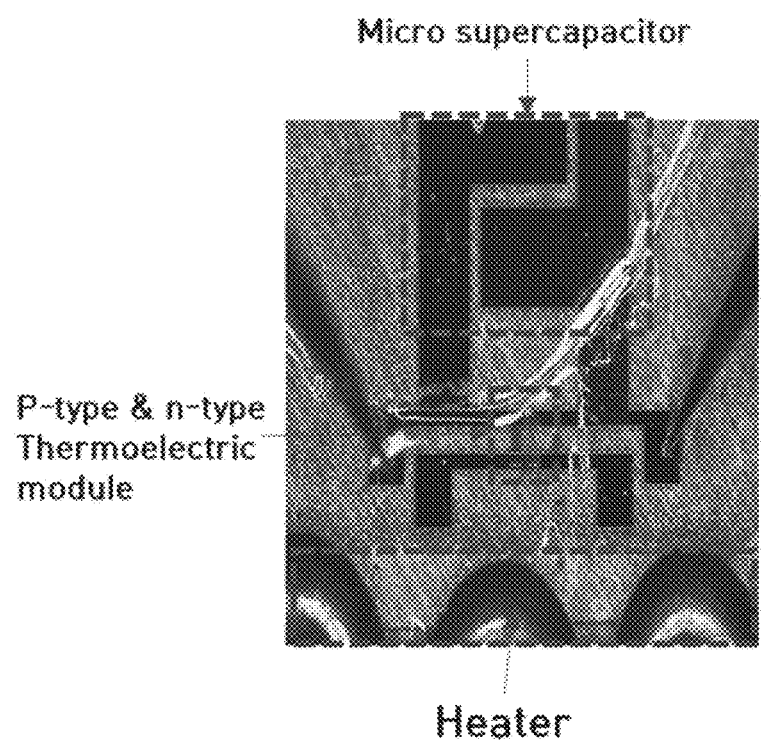
FIGS. 25 to 29 are diagrammatic and state views illustrating the results of examples of a thermoelectric micro-supercapacitor integrated device according to the present invention.
Figure 26:
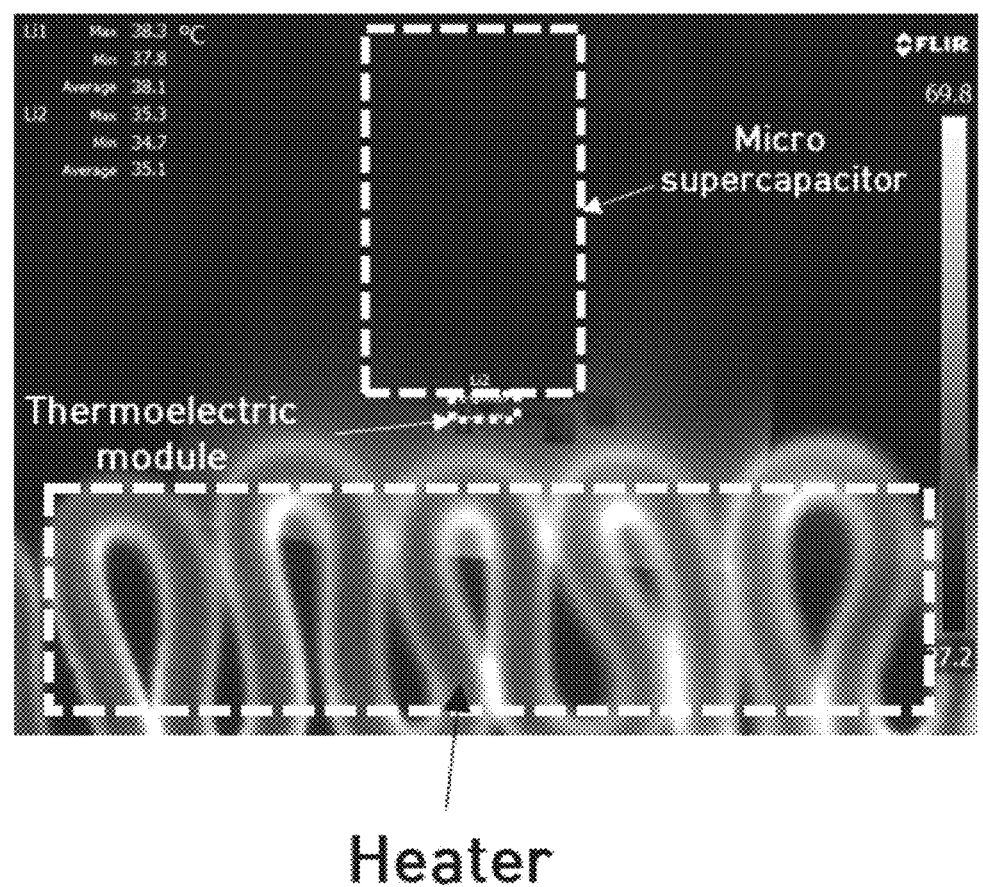
Figure 27:
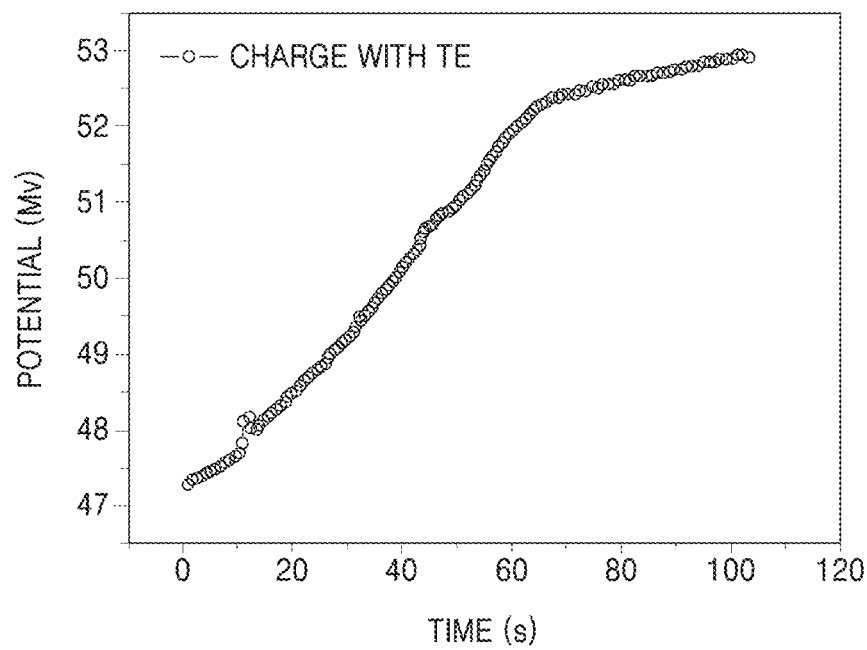
Figure 28:
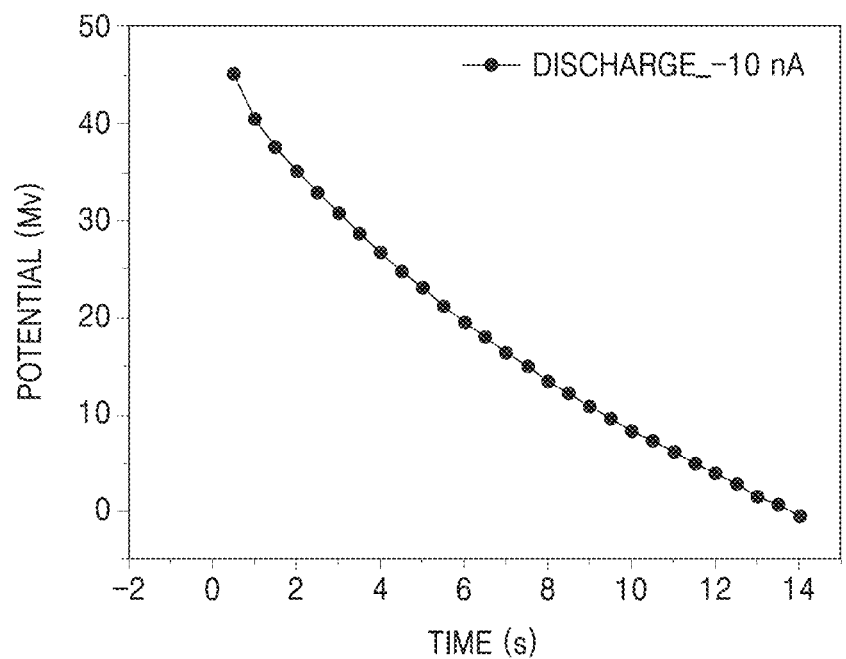

First, an arrangement path such as a configuration developed as shown in FIG. 21 is formed, and as shown in FIG. 22, when the temperature of one of both ends where the collector electrodes 310*a* including the rGO active electrode 340*a* are disposed is different from that of the other end thereof, i.e., when a temperature gradient (ΔT>0) is formed at both ends of the collector electrodes 310*a*, electric charges are actively generated from the n-type thermoelectric channel 230*n*. As shown in FIG. 23, when a load path interconnecting the both ends of the collector electrodes 310*a* is formed, the charging of the collector electrodes 310*a* is achieved due to an electric potential generated by the movement of the electric charges. Then, as shown in FIG. 24, even though the load path is removed and the temperature gradient formed at the both ends of the collector electrodes 310*a* is removed, the micro-supercapacitor module 300*a* including the collector electrodes 310*a* may maintain the charging state thereof to form a state of maintaining a dischargeable voltage.

Embodiment 1

An example of a study on the charge and discharge of a thermoelectric voltage actually generated from micro heat energy through the thermoelectric micro-supercapacitor integrated device of the present invention as described above in and from a micro supercapacitor is shown in FIGS. 25 to 28. As can be seen from an optical image in the embodiment, a micro heater is disposed at the lower end of FIG. 25 to perform a function of the high-temperature heat source, and an experiment was conducted using an integrated device in which a thermoelectric power generation module including an n-type thermoelectric channel and a p-type thermoelectric channel disposed between heat sources and a micro-supercapacitor module are integrated with each other. An experiment was conducted in which an electric current was applied to the micro heater as the high-temperature heat source to generate heat from the micro heater (FIG. 26), a thermoelectric voltage was generated from the thermoelectric power generation module using the heat energy of the micro heater, and the generated thermoelectric voltage was charged (FIG. 27) and discharged (FIG. 28) in and from the micro supercapacitor. As a result of real-time analysis of a state in which the thermoelectric voltage generated from the thermoelectric power generation module was charged in and discharged from the micro supercapacitor, it was found that a thermoelectric voltage of 50 mV was charged in and discharged from the micro supercapacitor.

Embodiment 2

A charge and discharge test was carried out by connecting a thermoelectric device module to the micro supercapacitor for one minute in a state in which the thermoelectric device module was placed on an experimenter's arm, other heat source environments, for example, a hot plate with various temperature ranges through the thermoelectric micro-supercapacitor integrated device of the present invention as described above.

Figure 29:
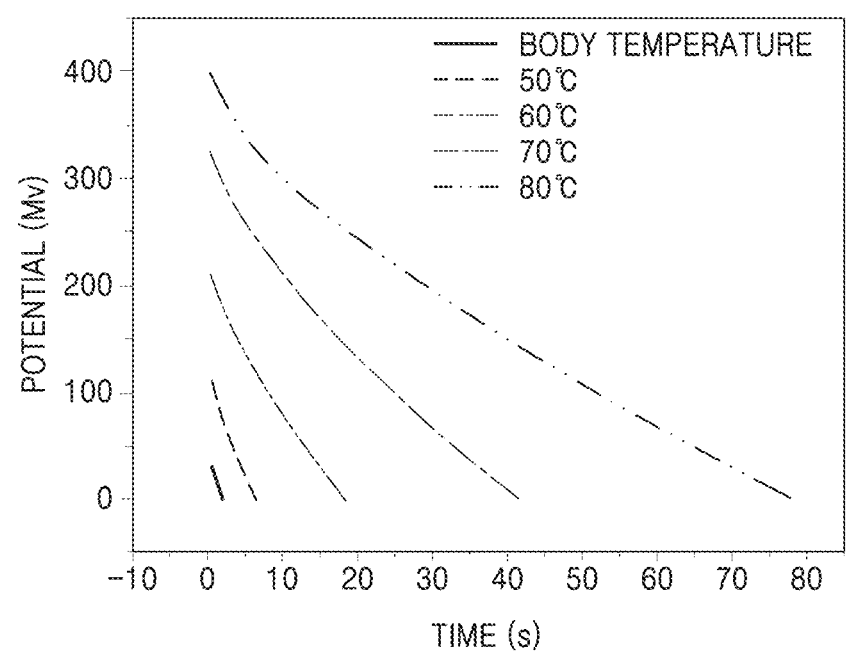

A voltage generated from the thermoelectric power generation module was stored in the micro supercapacitor for one minute depending on the experimenter's body temperature and the various temperature ranges (50, 60, 70, and 80° C.) of the hot plate, and a time-dependent change in the voltage of the micro supercapacitor was measured when the stored electrical energy is discharged. Resultantly, it was found that a thermoelectric voltage of 33 mV was charged through the body temperature, and a thermoelectric voltage ranging from 100 to 400 mV was charged at a temperature ranging from 50 to 80° C. of the hot plate (FIG. 29). Further, it was found that the production of sufficient electric power of a real life range could be accomplished in various temperature ranges, particularly with respect to a micro heat source difference of the experimenter's arm.

While the configuration and operation of the hybrid type thermoelectric micro-supercapacitor integrated device and the manufacturing method thereof of the present invention has been described in connection with the exemplary embodiments illustrated in the drawings, they are merely illustrative and the invention is not limited to these embodiments. It will be appreciated by a person having an ordinary skill in the art that various equivalent modifications, variations, and substitutions of the embodiments can be made without departing from the spirit and scope of the present invention. Therefore, the true technical scope of the present invention should be defined by the technical spirit of the appended claims.

What is claimed is:

1. A thermoelectric supercapacitor integrated device comprising:
    a thermoelectric power generation module comprising a thermoelectric unit body comprising a thermoelectric channel interposed between two different heat sources and disposed on a substrate, the thermoelectric channel being composed of an n-type or a p-type semiconductor; and
    a plurality of supercapacitor modules stacked together in a vertical direction away from a surface of the substrate and configured to be operated in cooperation with the thermoelectric power generation module,
    wherein each of the plurality of supercapacitor modules comprises a pair of collector electrodes between which an electric potential difference is generated through the thermoelectric channel.

2. The thermoelectric supercapacitor integrated device according to claim 1, wherein the thermoelectric unit body of the thermoelectric power generation module comprises:
    a high-temperature electrode disposed on the substrate so as to be positioned at a high-temperature side heat source of the two different heat sources;
    a pair of low-temperature electrodes disposed on the substrate so as to be positioned at a low-temperature side heat source of the two different heat sources, the low-temperature electrodes being spaced apart from the high-temperature electrode;
    a p-type thermoelectric channel configured to connect the high-temperature electrode and the low-temperature electrodes to each other and composed of a p-type semiconductor, and
    an n-type thermoelectric channel configured to connect the high-temperature electrode and the low-temperature electrodes to each other and composed of an n-type semiconductor, the n-type thermoelectric channel being disposed spaced apart from the p-type thermoelectric channel.

3. The thermoelectric supercapacitor integrated device according to claim 2, wherein each of the plurality of miniaturized supercapacitor modules is connected to each of both ends of the low-temperature electrodes.

4. The thermoelectric supercapacitor integrated device according to claim 3, wherein each of the pair of collector electrodes is connected at one end thereof to an associated one of the pair of low-temperature electrodes, the pair of collector electrodes being disposed spaced apart from each other, and
    wherein each of the plurality of supercapacitor modules comprises:
        a pair of opposed supercapacitor collectors connected at one ends thereof to the pair of collector electrodes, respectively, and disposed spaced apart from each other; and
        a dielectric layer disposed on the supercapacitor collectors.

5. The thermoelectric supercapacitor integrated device according to claim 4, wherein the pair of opposed supercapacitor collectors are stacked disposed on the low-temperature electrodes and the high-temperature electrode, respectively, when viewed vertically from above the substrate.

6. The thermoelectric supercapacitor integrated device according to claim 5, wherein each of the plurality of supercapacitor modules comprises an rGO (reduced graphene oxide) active electrode disposed on the pair of opposed supercapacitor collectors.

7. The thermoelectric supercapacitor integrated device according to claim 6, wherein the pair of opposed supercapacitor collectors, the rGO active electrode, and the dielectric layer are stacked in plural layers, and the pair of opposed supercapacitor collectors are stacked in the vertical direction from the surface of the substrate and connected.

8. The thermoelectric supercapacitor integrated device according to claim 7, wherein the thermoelectric unit body is disposed in plural numbers in such a manner as to be continuously arranged spaced apart from one another, and the plurality of supercapacitor modules further comprises a connection collector configured to connect the pair of opposed supercapacitor collectors for the thermoelectric unit body.

9. The thermoelectric supercapacitor integrated device according to claim 2, wherein the thermoelectric unit body is configured such that the pair of low-temperature electrodes, the high-temperature electrode, the p-type thermoelectric channel, and the n-type thermoelectric channel are connected in series with each other.

10. The thermoelectric supercapacitor integrated device according to claim 1, wherein the thermoelectric unit body of the thermoelectric power generation module comprises a thermoelectric channel interposed between the two heat sources and composed of an n-type or p-type semiconductor, and wherein each of the plurality of supercapacitor modules further comprises a dielectric layer interposed between the pair of collector electrodes and the thermoelectric channel composed of the n-type semiconductor.

11. The thermoelectric supercapacitor integrated device according to claim 10, wherein each of the plurality of supercapacitor modules comprises an rGO (reduced graphene oxide) active electrode disposed between the thermoelectric channel composed of the n-type semiconductor and the dielectric layer.

* * * * *